United States Patent
Browning et al.

(10) Patent No.: US 12,525,919 B2
(45) Date of Patent: Jan. 13, 2026

(54) HYBRID VACUUM ELECTRONICS COMMUNICATION AND SENSOR SYSTEM

(71) Applicant: BOISE STATE UNIVERSITY, Boise, ID (US)

(72) Inventors: Jim Browning, Boise, ID (US); Ranajoy Bhattacharya, Boise, ID (US); Robert Hay, Boise, ID (US)

(73) Assignee: BOISE STATE UNIVERSITY, Boise, ID (US)

( * ) Notice: Subject to any disclaimer, the term of this patent is extended or adjusted under 35 U.S.C. 154(b) by 932 days.

(21) Appl. No.: 17/730,835

(22) Filed: Apr. 27, 2022

(65) Prior Publication Data

US 2025/0247049 A1    Jul. 31, 2025

Related U.S. Application Data

(60) Provisional application No. 63/180,596, filed on Apr. 27, 2021.

(51) Int. Cl.
| | |
|---|---|
| *H03B 5/24* | (2006.01) |
| *G01D 5/24* | (2006.01) |
| *G01L 1/14* | (2006.01) |
| *G01L 9/00* | (2006.01) |
| *G01L 9/12* | (2006.01) |
| *H03B 5/10* | (2006.01) |
| *H03B 11/02* | (2006.01) |
| *H03B 28/00* | (2006.01) |
| *H03K 3/03* | (2006.01) |

(52) U.S. Cl.
CPC ................ *H03B 5/24* (2013.01); *G01D 5/24* (2013.01); *G01L 1/144* (2013.01); *G01L 9/0072* (2013.01); *G01L 9/12* (2013.01); *H03B 5/10* (2013.01); *H03B 11/02* (2013.01); *H03B 28/00* (2013.01); *H03K 3/0315* (2013.01)

(58) Field of Classification Search
CPC .......... H03B 28/00; H03B 11/02; H03B 5/10; H03B 5/22; H03K 3/03; H03K 3/0315; G01D 5/24; G01L 1/142; G01L 1/144; G01L 9/0072; G01L 9/12

See application file for complete search history.

(56) References Cited

U.S. PATENT DOCUMENTS 10,378,986 B1 *   8/2019   Scardelletti ........... G01L 9/0073

OTHER PUBLICATIONS

De Rose, Lucia B., Axel Scherer, and William M. Jones. "Suspended nanoscale field emitter devices for high-temperature operation." IEEE Transactions on Electron Devices 67.11 (2020): 5125-5131. (Year: 2020).*

Scardelletti, Maximilian C., et al. "Novel High Temperature Capacitive Pressure Sensor Utilizing SiC Integrated Circuit Twin Ring Oscillators." 2017 IEEE 67th Electronic Components and Technology Conference (ECTC). IEEE, 2017. (Year: 2017).*

(Continued)

*Primary Examiner* — Ryan Johnson
(74) *Attorney, Agent, or Firm* — Parsons Behle & Latimer (57) ABSTRACT

A device may include a substrate and an oscillation circuit integrated with the substrate. The oscillation circuit may include a field-emission-based vacuum transistor. The oscillation circuit may also include a capacitive transducer. An oscillation frequency of the oscillation circuit may be indicative of a magnitude of a temperature, a pressure, or a vibration at the capacitive transducer.

20 Claims, 9 Drawing Sheets

(56) References Cited

OTHER PUBLICATIONS

Wang, Run, Wen H. Ko, and Darrin J. Young. "Silicon-carbide MESFET-based 400/spl deg/C MEMS sensing and data telemetry." IEEE Sensors Journal 5.6 (2005): 1389-1394. (Year: 2005).*
Jones, William M., Daniil Lukin, and Axel Scherer. "Practical nanoscale field emission devices for integrated circuits." Applied Physics Letters 110.26 (2017). (Year: 2017).*
Han, Jin-Woo, Jae Sub Oh, and M. Meyyappan. "Vacuum nanoelectronics: Back to the future?—Gate insulated nanoscale vacuum channel transistor." Applied physics letters 100.21 (2012). (Year: 2012).*

* cited by examiner

HYBRID VACUUM ELECTRONICS COMMUNICATION AND SENSOR SYSTEM

CROSS-REFERENCE TO RELATED APPLICATIONS

This application claims the benefit of U.S. Provisional Patent Application No. 63/180,596, filed on Apr. 27, 2021 and entitled "Hybrid Vacuum Electronics Communication and Sensor System," the contents of which are incorporated by reference herein in their entirety.

GOVERNMENT LICENSE RIGHTS

This invention was made with government support under contract no. FA9550-18-1-0436 awarded by the Air Force Office of Scientific Research, a component of the Air Force Research Laboratory. The government has certain rights in the invention.

FIELD OF THE DISCLOSURE

This disclosure is generally related to the field of field-emission-based vacuum transistors and, in particular, to oscillator circuits and sensor systems including field-emission-based vacuum transistors.

BACKGROUND

Extreme environments, such as those having high temperatures (e.g., up to 800° C.) and/or those exhibiting high radiation exposure (e.g., greater than $1 \times 10^6$ rad) present a unique challenge for measurement. Typical sensors may include transducers for measuring a particular property and semi-conductor transistors configured to translate and transmit the measurements for interpretation by measurement equipment and instruments. However, these typical sensors may not be capable of withstanding extreme environments. For example, semi-conductor transistors may include materials, such as silicon oxides and dielectrics, that may fail in the presence of high heat. Further, in typical semi-conductor transistors electron transport through a dielectric medium may be significantly altered due to heat. Also, such transistors may be susceptible to charge trapping in the presence of X-rays and gamma rays, which may cause erroneous readings or even device failure.

In order to protect the transducers and semi-conductor transistors used in typical sensors, additional circuitry, shielding, and other protection mechanisms may be used. However, this may add to the complexity and may reduce the reliability to robust sensors. Other disadvantages may exist.

SUMMARY

Disclosed is a robust sensor that overcomes at least some of the disadvantages associated with typical robust sensors. The disclosed device may rely on vacuum transistor oscillation to measure properties and communicate the measurements. Vacuum electron devices may have inherent advantages in high temperature and high radiation environments because the primary electron interaction (modulation) may occur in a vacuum. Field emission devices may work on the basis of modulation of field emitted current through the variation of the vacuum barrier width using an applied field acting in vacuum. The principal reason they may be radiation tolerant is that electron transport may be in a vacuum which may not be affected by temperature or radiation.

In an embodiment, a device includes a substrate and an oscillation circuit integrated with the substrate. The oscillation circuit includes a field-emission-based vacuum transistor and a capacitive transducer. The field-emission-based vacuum transistor and the capacitive transducer are configured in combination with other components to effect and sustain oscillation.

In some embodiments, the field-emission-based vacuum transistor includes a collector, an emitter, and at least one gate positioned between the collector and the emitter, where the emitter has a pointed edge in proximity to the at least one gate, and where a space between the collector and the emitter is substantially void of gases and materials. In some embodiments, the capacitive transducer includes a thermal expansion material, and a variable capacitance of the capacitive transducer is based on a temperature of the thermal expansion material. In some embodiments, the capacitive transducer includes a first electrode positioned on a first wall and a second electrode positioned on a second wall, where a distance between the first electrode and the second electrode is proportional to a pressure exerted on the first wall, the second wall, or both, and wherein a variable capacitance of the capacitive transducer is based on the pressure. In some embodiments, the capacitive transducer includes a cantilever positioned between a first electrode and a second electrode, and wherein a variable capacitance of the capacitive transducer is based on vibration of the cantilever.

In some embodiments, the oscillation circuit is a feedback oscillation circuit, where the field-emission-based vacuum transistor is a first field-emission-based vacuum transistor, and where the feedback oscillation circuit further includes at least a second field-emission-based vacuum transistor. In some embodiments, the oscillation circuit is a Wein bridge oscillation circuit, where the field-emission-based vacuum transistor is a first field-emission-based vacuum transistor, where the oscillation circuit further includes additional field-emission-based vacuum transistors. In some embodiments, the oscillation circuit is a Colpitts oscillation circuit, where the Colpitts oscillation circuit further includes an inductor. In some embodiments, the capacitive transducer is a first capacitive transducer, and the Colpitts oscillation circuit further includes a second capacitive transducer. In some embodiments, the oscillation circuit is a ring oscillation circuit, where the field-emission-based vacuum transistor is a first field-emission-based vacuum transistor, and where the ring oscillation circuit further includes additional field-emission-based vacuum transistors. In some embodiments, the capacitive transducer is a first capacitive transducer, and the ring oscillation circuit further comprises a second capacitive transducer.

In some embodiments, the substrate comprises a material capable of withstanding any temperature between −80° C. and 800° C. In some embodiments, the substrate includes a material capable of withstanding radiation exposure greater than $1 \times 10^6$ rad. In some embodiments, the oscillation circuit is a first oscillation circuit, the field-emission-based vacuum transistor is a first field-emission-based vacuum transistor, the capacitive transducer is a first capacitive transducer, and the device further includes a second oscillation circuit, the second oscillation circuit including a second field-emission-based vacuum transistor and a second capacitive transducer. The first oscillation circuit is configured to have a first oscillation frequency in response to a set of stimuli at the first capacitive transducer, and the second oscillation circuit is configured to have a second oscillation frequency in response to the set of stimuli at the second capacitive transducer that is different than the first oscillation frequency. In some embodiments, the device includes one or more additional oscillation circuits, the one or more additional oscillation circuits including one or more additional field-emission-based vacuum transistors, and one or more additional capacitive transducers. The one or more additional oscillation circuits are configured to have additional oscillation frequencies in response to the set of stimuli at the one or more additional capacitive transducers that are different than the first oscillation frequency and the second oscillation frequency, and that are different from each other.

In an embodiment, a device includes an oscillation circuit, the oscillation circuit including at least one field-emission-based vacuum transistor, and at least one capacitive transducer, where the oscillation circuit omits any thermionic-emission-based vacuum device. In some embodiments, a variable capacitance of the capacitive transducer is based on a temperature, a pressure, or a vibration at the capacitive transducer. In some embodiments, an oscillation frequency of the oscillation circuit is based on the variable capacitance of the capacitive transducer. In some embodiments, the oscillation frequency is indicative of a magnitude of the temperature, the pressure, or the vibration. In some embodiments, the device includes additional oscillation circuits, the additional oscillation circuits including additional filed-emission-based vacuum transistors, and additional capacitive transducers, where additional oscillation frequencies of the additional oscillation circuits are indicative of additional magnitudes of additional temperatures, additional pressures, or additional vibrations at the additional capacitive transducers.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure.

DETAILED DESCRIPTION

Figure 1:
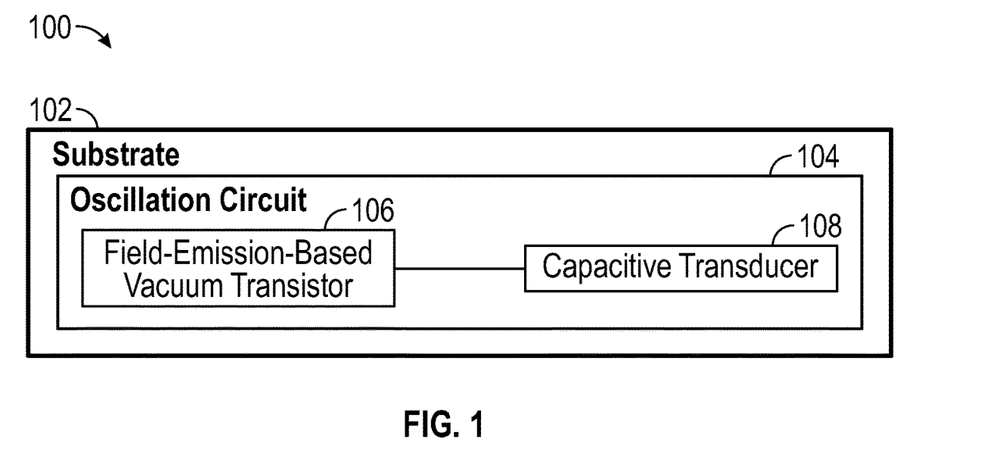
FIG. 1 is a block diagram depicting an embodiment of a robust sensor device 100 using vacuum transistor oscillation.

Referring to FIG. 1, an embodiment of a robust sensor device 100 is depicted. The device 100 may rely on the use of vacuum transistor oscillation. For example, the device 100 may include a substrate 102 with an oscillation circuit 104 integrated with the substrate 102. The oscillation circuit 104 may include a field-emission-based vacuum transistor 106 and a capacitive transducer 108.

During operation, a variation in temperature, vibration amplitude and frequency, pressure, force, stress, and strain at the capacitive transducer 108 may affect a variable capacitance of the capacitive transducer 108. The oscillation circuit 104 may be configured, in conjunction with the capacitive transducer 108, to exhibit an oscillation frequency based on the variable capacitance. By measuring the oscillation frequency of the oscillation circuit 104, the vibration amplitude and frequency, the pressure, the force, and/or the strain may be determined.

Notably, the oscillation circuit 104 may omit typical non-vacuum oscillators (e.g., oscillators that rely on junction transistors and/or dielectric-based field-effect transistors) and may omit any thermionic-emission-based vacuum device (e.g., vacuum tubes). This may result in significant power savings and enable the oscillation circuit to function in extreme conditions. For example, the substrate 102 may include a material capable of withstanding any and all temperatures between −80° C. and 800° C. and may also be capable of withstanding radiation exposure greater than $1 \times 10^6$ rad. Because operation of the field-emission-based vacuum transistor is not based on heat, it may be capable of operating at such temperatures and radiation exposures.

Figure 2:
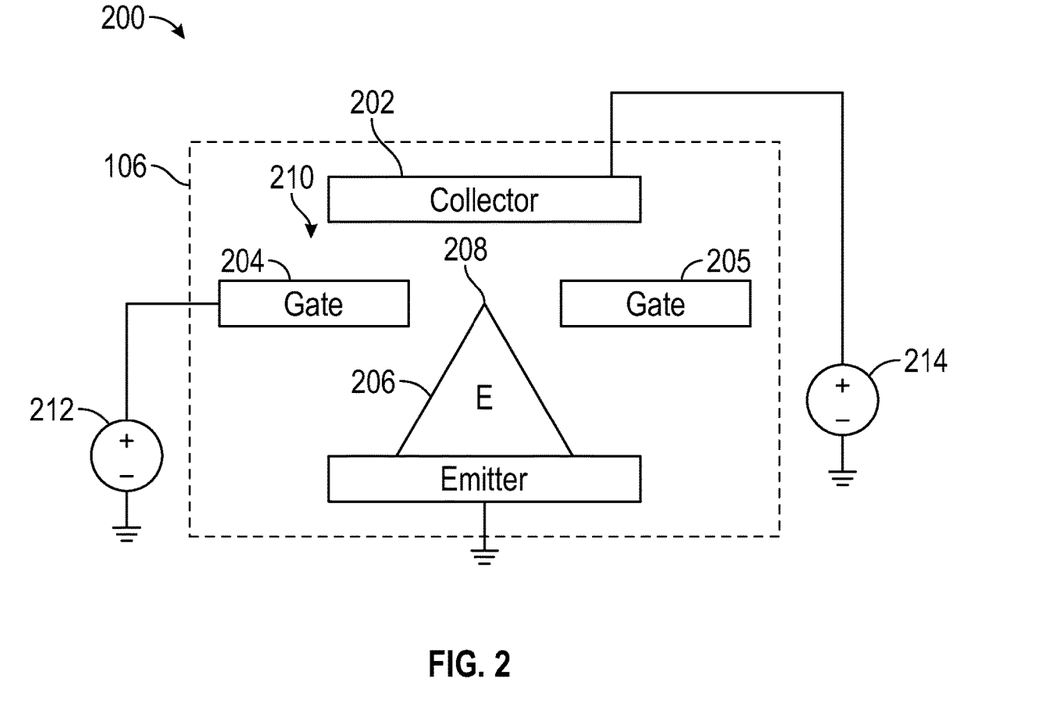
FIG. 2 is a schematic diagram depicting an embodiment of a field-emission-based vacuum transistor configuration.

Referring to FIG. 2, an embodiment of a field-emission-based vacuum transistor configuration 200 is depicted. The field-emission-based vacuum transistor 106 from FIG. 1 may include a collector 202, a first gate 204, a second gate 205, and an emitter 206. A space 210 between the collector 202 and the emitter 206 may be substantially void of gases and material. Further, the emitter 206 may include a pointed edge 208 that may facilitate the field emission properties. In the example configuration 200 a first voltage source 212 may be applied to the first gate 204, a second voltage source 214 may be applied to the collector 202, and the emitter 206 may be grounded. It should be noted that this configuration 200 of FIG. 2 is an example and, in practice, the structure of the field-emission-based vacuum transistor 106 may differ from that shown. For example, in some embodiments, the second gate 205 may be omitted.

Figure 3:
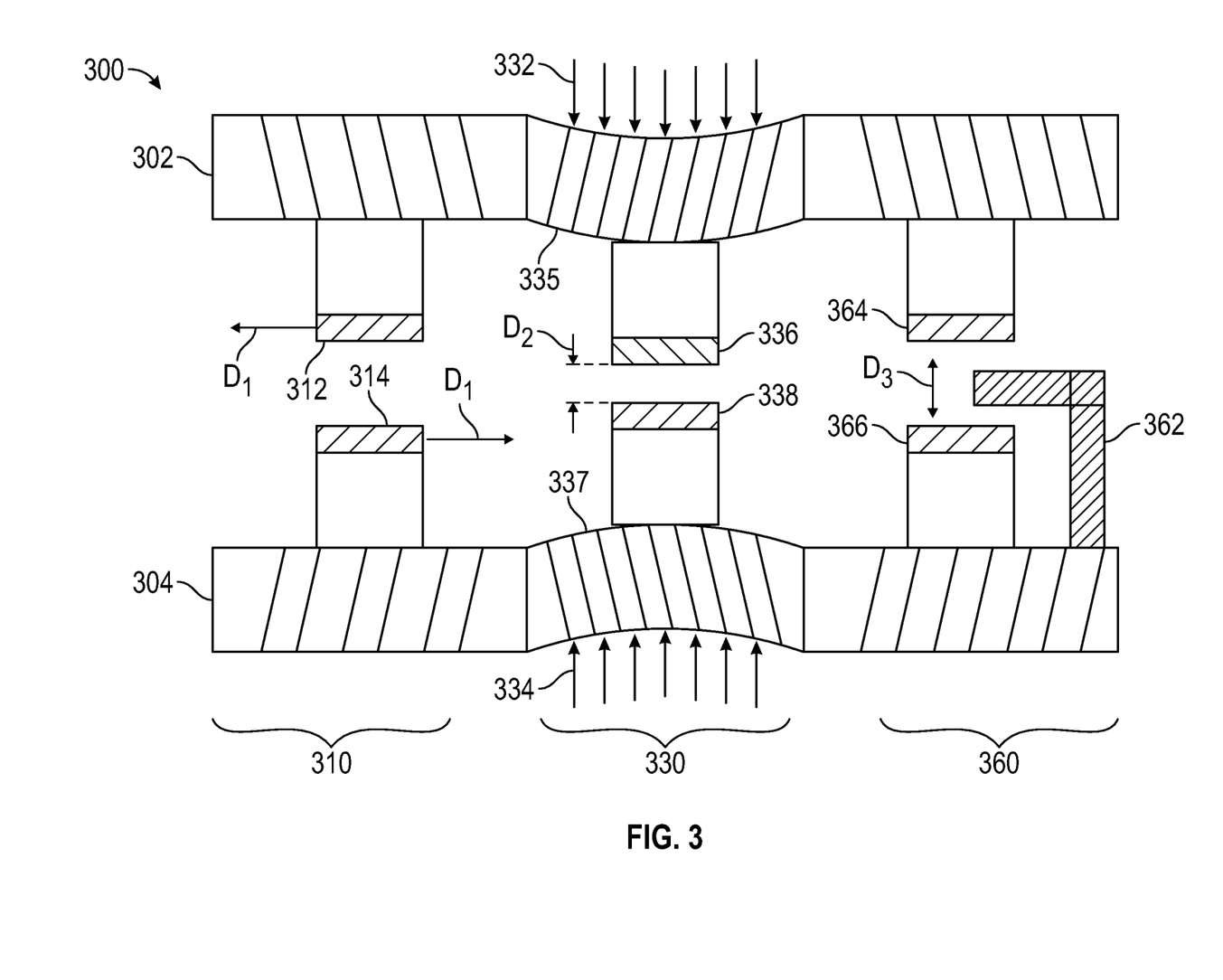
FIG. 3 is a cross-section diagram depicting an embodiment of a robust sensor device.

Referring to FIG. 3, an example embodiment of a robust sensor device 300 is depicted. The device 300 is for example purposes and illustrates multiple different types of transducers integrated between a first substrate portion 302 and a second substrate portion 304. However, in practice, the device 300 may include a single transducer, multiple transducers of a single type, or multiple types of transducers, depending on how the robust sensor device 300 is applied. Further, one or more of the transducers shown in FIG. 3 may correspond to the capacitive transducer 108 of FIG. 1 and may be integrated into the oscillation circuit 104 even though such connections are not shown in FIG. 3. In this way, a capacitance variation of any of the transducers depicted in FIG. 2 may be used to measure properties of interest as described herein.

Returning to FIG. 3, for example purposes, the device 300 is illustrated as having a first capacitive transducer 310, a second capacitive transducer 330, and a third capacitive transducer 360. The first capacitive transducer 310 may be configured to vary in capacitance based on a variation in temperature. For example, the first substrate portion 302 and the second substrate portion 304 may expand at different rates in response to temperature. In other words, the first substrate portion 302, the second substrate portion 304, or both may include a thermal expansion material, which may be selected to correspond to a desired capacitance range. A first electrode 312 of the first capacitive transducer 310 may be positioned on the first substrate portion 302 and a second electrode 314 of the first capacitive transducer 310 may be positioned on the second substrate portion 304. The different in thermal expansion between the substrate portions 302, 304 may result in a changed distance between the electrodes 312, 314 as denoted by the arrows D1, which may also result in a changed capacitance between the electrodes 312, 314. Thus, when the first capacitive transducer 310 is combined with an oscillation circuit, such as the oscillation circuit 104, a frequency of the oscillation circuit 104 may be based on the temperature at the first capacitive transducer 310.

The second capacitive transducer 330 may be configured to vary in capacitance based on a variation in pressure. For example, the second capacitive transducer 330 may include a first electrode 336 positioned on a first wall 335 of the first substrate portion 302 and a second electrode 338 positioned on a second wall 337 of the second substrate portion 304. In response to a pressure change (denoted by the arrows 332, 334) applied to the first substrate portion 302 and the second substrate portion 304, a distance change (denoted by the arrow D2) may occur between the electrodes 336, 338. The distance change D2 may, in turn, result in changed capacitance between the electrodes 336, 338. In other words, the capacitance between the electrodes 336, 338 may be proportional to a pressure applied to the first wall 335 and the second wall 337. Thus, when the second capacitive transducer 330 is combined with an oscillation circuit, such as the oscillation circuit 104, a frequency of the oscillation circuit 104 may be based on the pressure change 332, 334 at the second capacitive transducer 330.

The third capacitive transducer 360 may be configured to vary in capacitance based on vibrations at a cantilever 362 positioned in proximity to a first electrode 364 and a second electrode 366. Changes in the vibrations at the cantilever may be caused by accelerations or other forces applied to the third capacitive transducer 360. Thus, when the third capacitive transducer 360 is combined with an oscillation circuit, such as the oscillation circuit 104, a frequency of the oscillation circuit 104 may be based on vibrations at the third capacitive transducer 360.

The table below summarizes the frequency response for each of the examples given above:

| Sensor Measurement | Variable Property | Measured Response |
| --- | --- | --- |
| Temperature | $D_{1T}$ -- Capacitance | Frequency ($f_{1T}$) |
| Vibration amplitude and frequency | $D_{2V}$ and $D_{3V}$ - Capacitance | Frequencies ($f_{2v}$ and $f_{3v}$) |
| Force or Pressure | $D_{3P}$ -- Capacitance | Frequency ($f_{4P}$) | where a frequency variation from temperature ($f_{1T}$) may be based on a capacitance related to a distance based on temperature ($D_{1T}$), where frequency variations from vibrations ($f_{3v}$ and $f_{4v}$) may be based on a capacitance based on movement of the cantilever 362 ($D_{2V}$ and $D_{3V}$), and where frequency variations from pressure ($f_{2p}$) may be based on a capacitance related to a distance based on pressure ($D_{3P}$). Other possible variable properties and measured responses may be usable with the system described herein.

Figure 4:
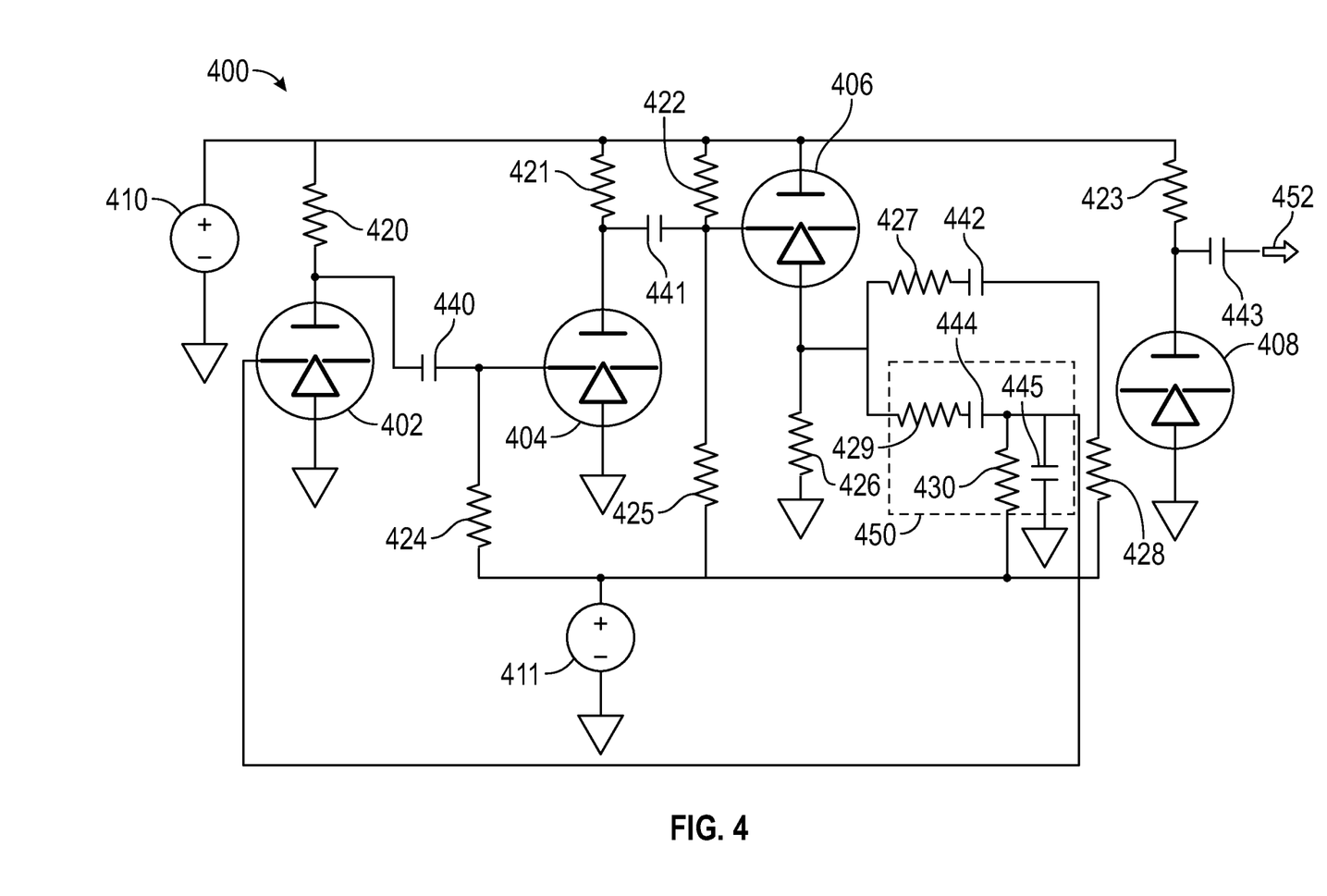
FIG. 4 is a schematic diagram depicting an embodiment of a Wein bridge oscillation circuit including a field-emission-based vacuum transistor.
Figure 5:
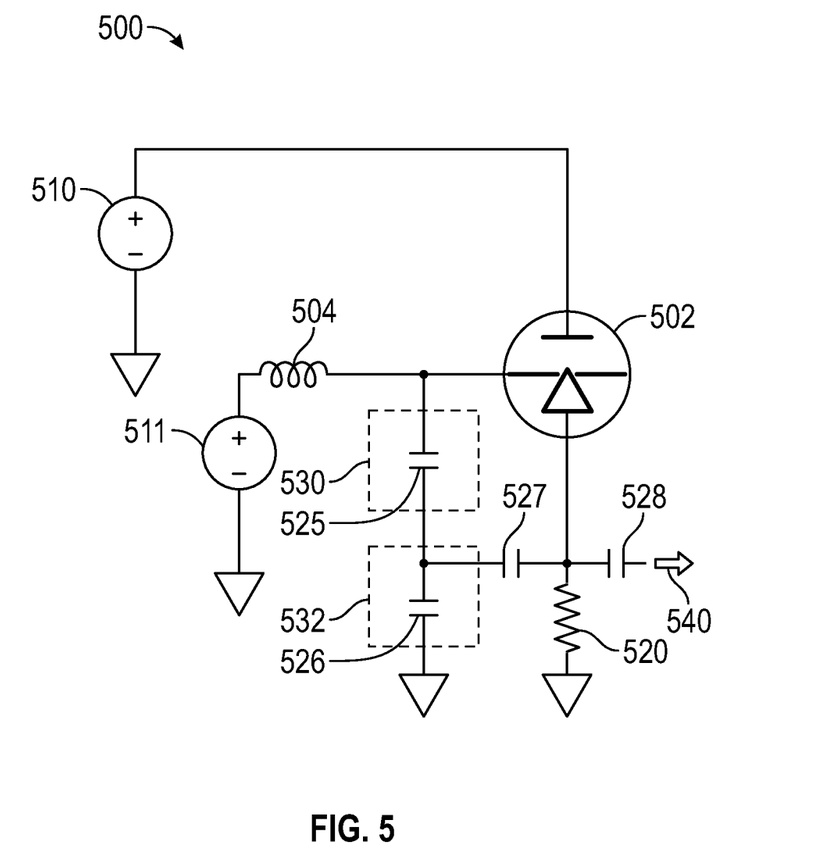
FIG. 5 is a schematic diagram depicting an embodiment of a Colpitts oscillation circuit including a field-emission-based vacuum transistor.
Figure 6:
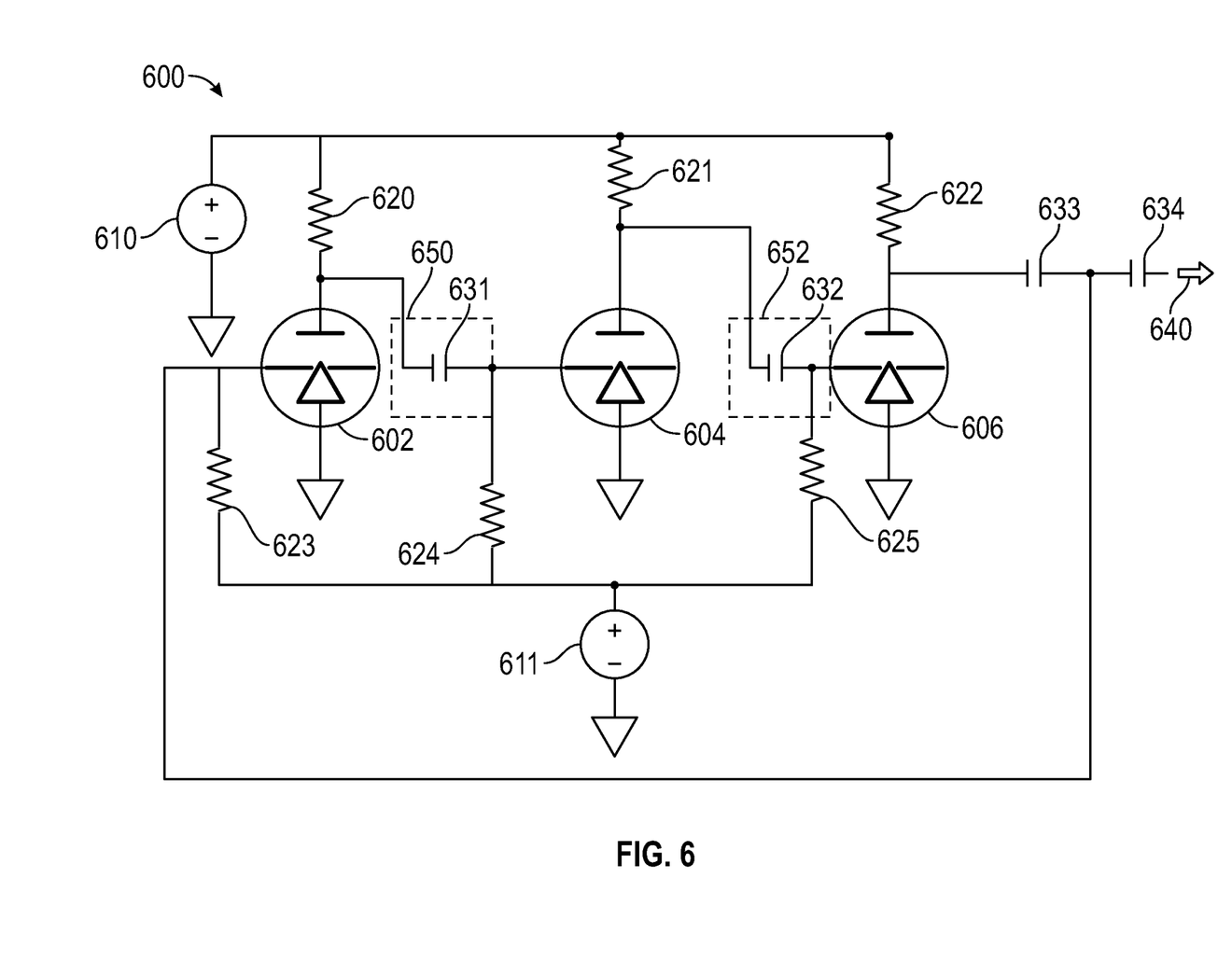
FIG. 6 is a schematic diagram depicting an embodiment of a ring oscillation circuit including a field-emission-based vacuum transistor.

Referring to FIGS. 4-6, some examples of vacuum transistor-based oscillation circuits that may correspond to the oscillation circuit 104 are described. The oscillation circuit 104 may be a feedback oscillation circuit as described herein and may, in some cases, include multiple field-emission-based vacuum transistors. However, it should be noted that the disclosure is not limited to these examples. Other configurations may exist.

Referring to FIG. 4, a Wein bridge oscillation circuit 400 is depicted. The circuit 400 may correspond to the oscillation circuit 104 of FIG. 1. To produce oscillation, the circuit 400 may include a first field-emission-based vacuum transistor 402, a second field-emission-based vacuum transistor 404, a third field-emission-based vacuum transistor 406, and a fourth field-emission-based vacuum transistor 408. The circuit 400 may further include a first voltage source 410 and a second voltage source 411. The circuit 400 may also include resistors 420, 421, 422, 423, 424, 425, 426, 427, 428, 429, 430 and capacitors 440, 441, 442, 443, 444, 445 positioned to produce a voltage oscillation at an output 452. The dotted box in FIG. 4 represents a capacitive transducer 450, which may be modeled as the resistors 429, 430 and the capacitors 444, 445. By substituting the resistors 429, 430 and the capacitors 444, 445 with any of the capacitive transducers 310, 330, 360, a robust sensor may be formed that communicates the sensed property via an oscillation frequency of the oscillation circuit 400. In other words, field-emission-based vacuum transistors 402, 404, 406, 408 may correspond, individually or collectively, to the field-emission-based vacuum transistor 106 and the capacitive transducer 450 may correspond to the capacitive transducer 108 of FIG. 1.

Referring to FIG. 5, a Colpitts oscillation circuit 500 is depicted. The circuit 500 may correspond to the oscillation circuit 104 of FIG. 1. To produce oscillation, the circuit 500 may include a field-emission-based vacuum transistor 502 and an inductor 504. The circuit 500 may further include a first voltage source 510 and a second voltage source 511. The circuit 500 may also include a resistor 520 and capacitors 525-528 positioned to produce a voltage oscillation at an output 540. The dotted boxes in FIG. 5 represent capacitive transducers 530, 532, which may be modeled as the capacitors 525, 526. By substituting either or both of the capacitors 525, 528 with any of the capacitive transducers 310, 330, 360, a robust sensor may be formed that communicates the sensed property via an oscillation frequency of the oscillation circuit 500.

During operation, the Colpitts oscillation circuit 500 may use a capacitive voltage divider network as its feedback source. The two capacitors 525, 526 may be placed across a single common inductor 504. The emitter terminal of the field-emission-based vacuum transistor 502 may effectively connect to the junction of the two capacitors 525, 526, which may be connected in series and may act as a simple voltage divider. When power is applied to the gate, the capacitors 525, 526 may charge and then discharge through the inductor 504. The oscillations across the capacitors 525, 526 may be applied to the gate-emitter junction and appear at the collector output. The resistor 520 may provide a stabilizing DC bias for the field-emission-based vacuum transistor 502 while the additional capacitors 527, 528 act as a DC-blocking bypass capacitor. Simulation and measurement results of the circuit 500 are presented further below.

Referring the FIG. 6, a ring oscillation circuit 600 is depicted. The circuit 600 may correspond to the oscillation circuit 104 of FIG. 1. To produce oscillation, the circuit 600 may include a first field-emission-based vacuum transistor 602, a second field-emission-based vacuum transistor 604, and a third field-emission-based vacuum transistor 606. The circuit 500 may further include a first voltage source 610 and a second voltage source 611. The circuit 600 may also include resistors 620, 621, 622, 623, 624, 625 and capacitors 631, 632, 633, 634 positioned to produce a voltage oscillation at an output 640. The dotted boxes in FIG. 6 represent capacitive transducers 650, 652, which may be modeled as the capacitors 631, 632. By substituting either, or both, of the capacitors 531, 634 with any of the capacitive transducers 310, 330, 360, a robust sensor may be formed that communicates the sensed property via an oscillation frequency of the oscillation circuit 600.

Figure 7:
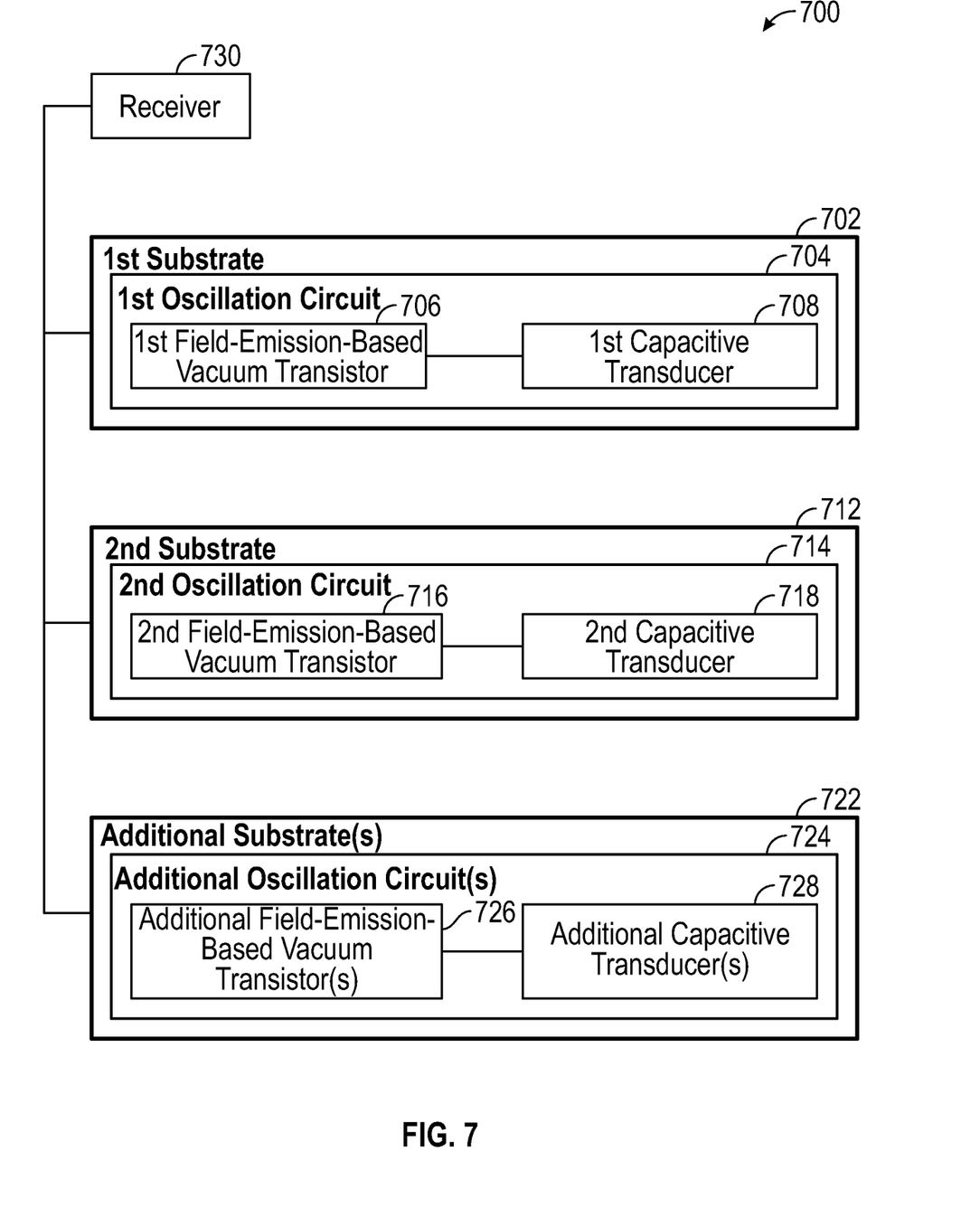
FIG. 7 is a block diagram depicting an embodiment of a robust sensor system 700.

Referring to FIG. 7, an embodiment of a robust sensor system 700 is depicted. The system 700 may include a first substrate 702 having a first oscillation circuit 704, a second substrate 712 having a second oscillation circuit 714, and one or more additional substrates 722 having one or more additional oscillation circuits 724. Although the system is depicted as having three separate substrates, in practice, one or more of the oscillation circuits 704, 714, 724 may be integrated with a single substrate depending on the application of the system 700.

The first oscillation circuit 704 may include a first field-emission-based vacuum transistor 706 and a first capacitive transducer 708. The second oscillation circuit 714 may include a second field-emission-based vacuum transistor 716 and a second capacitive transducer 718. The one or more additional oscillation circuits 724 may include one or more additional field-emission-based vacuum transistors 726 and one or more additional capacitive transducer 728.

The first oscillation circuit 704 may be configured to have a first oscillation frequency in response to a set of stimuli at the first capacitive transducer 708. The second oscillation circuit 714 may be configured to have a second oscillation frequency in response to the same set of stimuli at the second capacitive transducer 718. The first and second oscillation frequencies may be distinct from each other, such that a receiver 730 can determine which oscillation circuit produces a particular measurement. In that way, each of the oscillation circuits 704, 714 may be associated with a particular "carrier" frequency and the level of variation around the carrier frequency may be indicative of a measured property (e.g., temperature, pressure, or vibration) as described herein. Likewise, the one or more additional oscillation circuits 724 may be configured to have additional oscillation frequencies in response to the same set of stimuli that are different than the first response frequency and the second response frequency, and that are different from each other.

A benefit of the system 700 is that multiple robust sensors may be used in an extreme temperature or radiation environment without added circuitry and hardware that may be susceptible to failure in harsh environments. Other benefits may exist.

The three circuit designs from FIGS. 4, 5, and 6 have been simulated using LTSpice and have been shown to work as oscillators using a vacuum transistor model developed from experimental results. Among these circuits, the Colpitts oscillator circuit (FIG. 5) has been demonstrated experimentally, the results of which simulations and demonstrations are described below.

Figure 8:
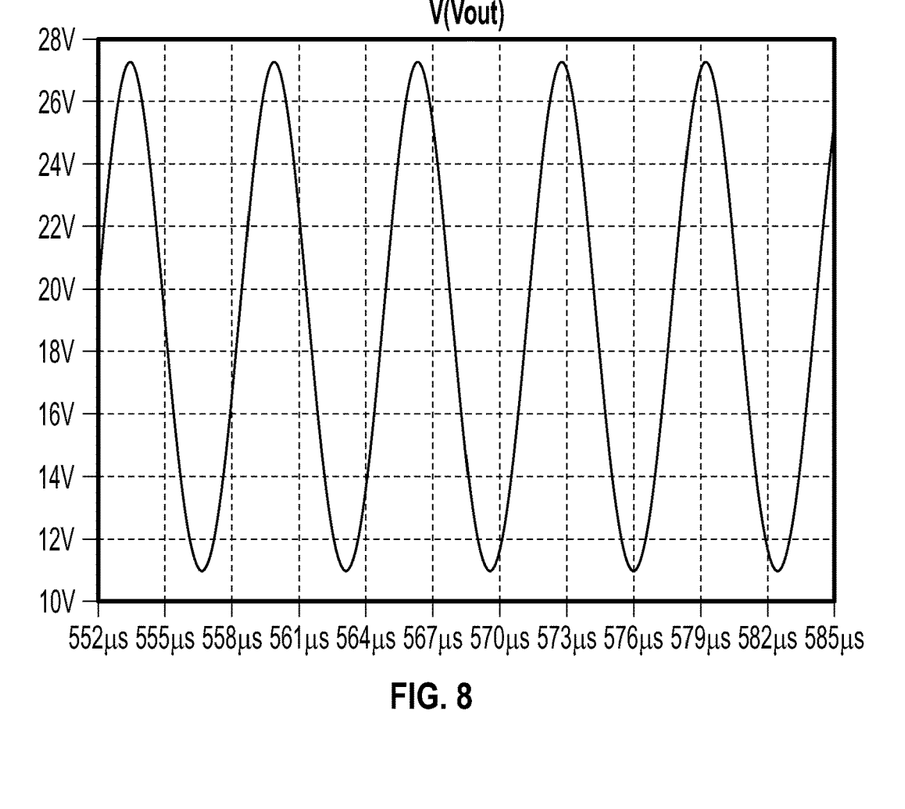
FIG. 8 is a graph depicting the results of a simulation of a Colpitts oscillation circuit including a modeled field-emission-based vacuum transistor.

Referring to FIG. 8, a graph depicts the results of a simulation of a Colpitts oscillation circuit having a field-emission-based vacuum transistor. Using experimentally derived data and a Ranadive fit, an output characteristics model corresponding to a field-emission-based vacuum transistor was developed using LTSpice. Using the model, a Colpitts oscillator circuit was developed as depicted substantially as shown in FIG. 5. As shown in FIG. 8, the simulation results where the oscillation frequency is ~152 kHz with a peak-to-peak voltage (Vpp) of ~16V. The oscillation frequency can be increased by modifying the inductor 504 of FIG. 5 to have a value of 5 mH and the capacitors 525, 526 to both have values of 346 p. A measured capacitance of the transistor gate to emitter was used in the model.

Figure 9:
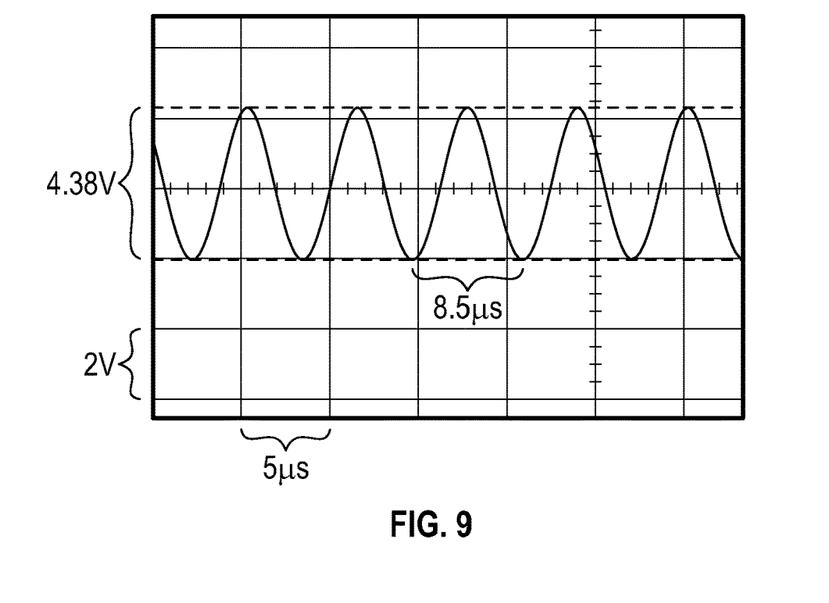
FIG. 9 is a graph depicting an oscilloscope trace of a demonstrated Colpitts oscillation circuit including a field-emission-based vacuum transistor.
Figure 10:
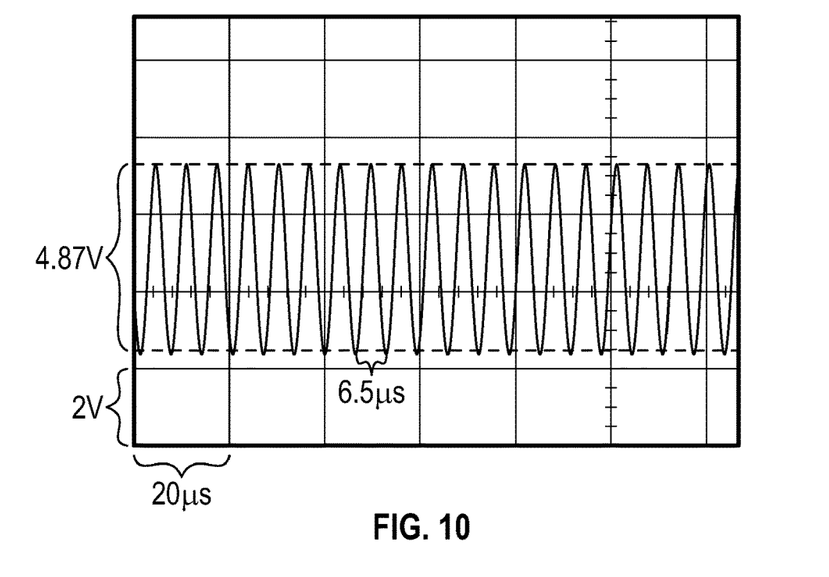
FIG. 10 is a graph depicting an oscilloscope trace of a demonstrated Colpitts oscillation circuit including a field-emission-based vacuum transistor.
Figure 11:
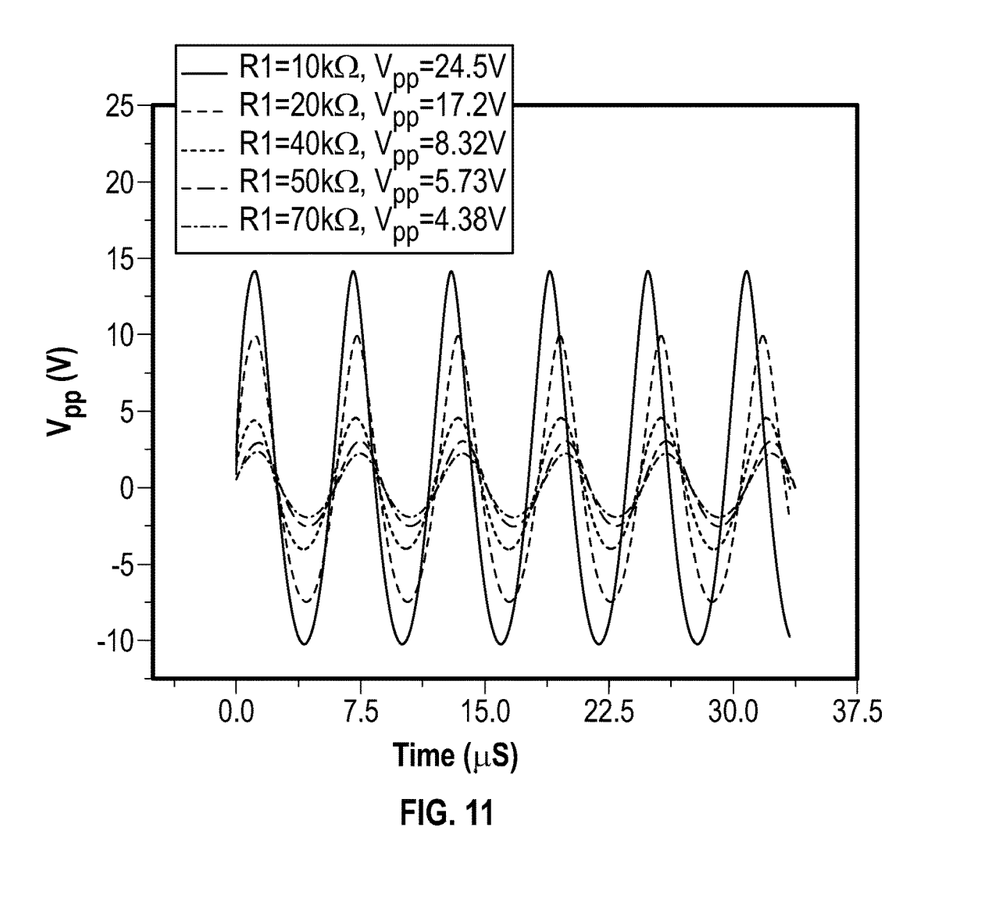
FIG. 11 is a graph depicting oscilloscope traces as a function of changes in an output resistor in a Colpitts oscillation circuit including a field-emission-based vacuum transistor.

Referring to FIG. 9, a graph depicts an oscilloscope trace of a demonstrated Colpitts oscillation circuit including a field-emission-based vacuum transistor. Based on the Colpitts oscillation circuit of FIG. 5, a circuit was realized experimentally. The experimental result can be seen in the FIG. 9 where the oscillation frequency was ~152.1 kHz with a Vpp of ~4.38 V. In these results, an output resistor (i.e., the resistor 520 of FIG. 5) had a value of 56 k$\Omega$.

Referring to FIGS. 10-13, additional experimental results were conducted, and a comparison was made between the experimental results and simulation results. A design of the circuit was substantially similar to the design shown in FIG. 5 and had the capacitance value for the capacitors 525, 526 as 346 pF. The inductor 504 had a value of 5 mH. The simulated frequency was 152 kHz with a Vpp of ~16 V where a gate voltage was 50 V, a collector voltage was 210 V, and the output resistor 520 had a value of 56 k$\Omega$. The generated model for the field-emission-based vacuum transistor was used to extrapolate the emission current for higher gate voltages. The oscillation frequency can be changed by modifying the inductor 504 and the capacitors 525, 526. The experimental results can be seen in FIG. 10 which shows the oscilloscope trace, where the measured oscillation frequency was 152.1 kHz with a Vpp of 4.9 V, which was the same as the simulation for all the parameters. This experimental Vpp is three time less than the simulation prediction where the oscillation frequency was 152.2 kHz. This mismatch in VPP was the result of the equivalent series resistance (ESR) of the passive components (inductors and capacitors). ESR values for all the passive components were measured and incorporated in the model. After the model was updated with the measured ESR (with the inductor 504 having an ESR of about 323$\Omega$, each capacitor 525, 526 having an ESR of about 136$\Omega$, and the total circuit having an ESR of about 595$\Omega$), the simulated VPP was 5.5 V. This agrees well with the experimental result.

Further, the output resistor 520 of FIG. 5 was varied from 10 k$\Omega$ to 70 k$\Omega$ in the experiment. In each case, the gate voltage was fixed at 50 V and the collector voltage was fixed at 210 V. From FIG. 11, which shows the oscillation signal from the oscilloscope, it can be seen that the output resistor 520 has a large influence on the Vpp as expected because it acts as a ballast resistor, limiting emission current, and when the resistor 520 had a value of 10 kΩ, the Vpp was 25 V.

Figure 12:
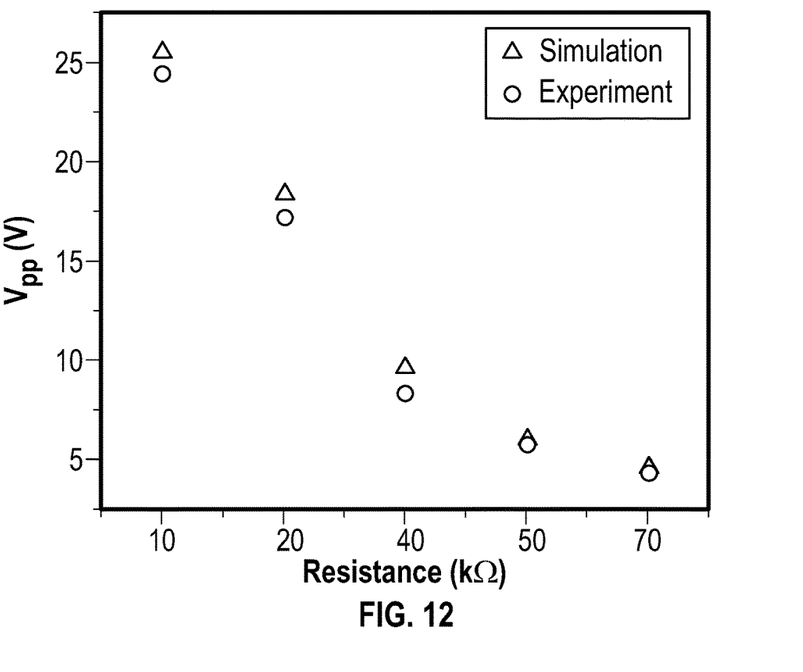
FIG. 12 is a graph depicting a simulation and experimental comparison of a peak-to-peak voltage output as a function of changes in an output resistor for a Colpitts oscillation circuit including a field-emission-based vacuum transistor.
Figure 13:
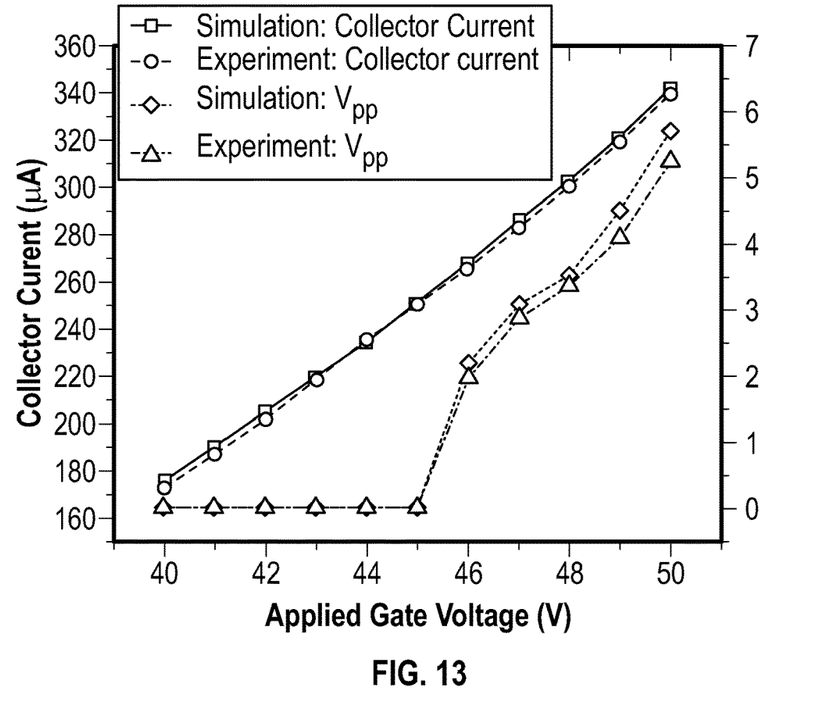
FIG. 13 is a graph depicting a simulation and experimental comparison of a collector current and peak-to-peak voltage as a function of applied gate voltage for a Colpitts oscillation circuit including a field-emission-based vacuum transistor.

FIG. 12 shows the variation of Vpp with the series resistance, and it can be seen that the simulation and experiments agree well. The relation between the resistor 520 and Vpp is due to the exponential variation of the field emission current with gate voltage limited by the series resistance. FIG. 13 shows the collector voltage and Vpp as function of gate voltage for the experiment and the simulation. From FIG. 13, the start oscillation voltage is 45 V, and the corresponding start oscillation current is 230 μA. Note that this study was carried out keeping the output resistor 520 at a value of 56 kΩ and the collector voltage fixed at 210 V.

Although various embodiments have been shown and described, the present disclosure is not so limited and will be understood to include all such modifications and variations as would be apparent to one skilled in the art.

What is claimed is:

1. A device comprising:
   a substrate; and
   an oscillation circuit integrated with the substrate, the oscillation circuit comprising:
      a field-emission-based vacuum transistor; and
      a capacitive transducer, wherein the capacitive transducer includes a thermal expansion material, and wherein a variable capacitance of the capacitive transducer is based on a temperature of the thermal expansion material,
      wherein the field-emission-based vacuum transistor and the capacitive transducer are configured in combination with other components to effect and sustain oscillation.

2. The device of claim 1, wherein the field-emission-based vacuum transistor comprises:
   a collector;
   an emitter; and
   at least one gate positioned between the collector and the emitter, wherein the emitter has a pointed edge in proximity to the at least one gate, and wherein a space between the collector and the emitter is substantially void of gases and materials.

3. The device of claim 1, wherein the oscillation circuit is a feedback oscillation circuit, wherein the field-emission-based vacuum transistor is a first field-emission-based vacuum transistor, wherein the feedback oscillation circuit further comprises at least a second field-emission-based vacuum transistor.

4. The device of claim 1, wherein the oscillation circuit is a Wein bridge oscillation circuit, wherein the field-emission-based vacuum transistor is a first field-emission-based vacuum transistor, wherein the oscillation circuit further comprises additional field-emission-based vacuum transistors.

5. The device of claim 1, wherein the oscillation circuit is a Colpitts oscillation circuit, wherein the Colpitts oscillation circuit further comprises an inductor.

6. The device of claim 5, wherein the capacitive transducer is a first capacitive transducer, and wherein the Colpitts oscillation circuit further comprises a second capacitive transducer.

7. The device of claim 1, wherein the oscillation circuit is a ring oscillation circuit, wherein the field-emission-based vacuum transistor is a first field-emission-based vacuum transistor, and wherein the ring oscillation circuit further comprises additional field-emission-based vacuum transistors.

8. The device of claim 7, wherein the capacitive transducer is a first capacitive transducer, and wherein the ring oscillation circuit further comprises a second capacitive transducer.

9. The device of claim 1, wherein the substrate comprises a material capable of withstanding any temperature between −80° C. and 800° C.

10. The device of claim 1, wherein the substrate comprises a material capable of withstanding radiation exposure greater than $1 \times 10^6$ rad.

11. The device of claim 1, wherein the oscillation circuit is a first oscillation circuit, wherein the field-emission-based vacuum transistor is a first field-emission-based vacuum transistor, wherein the capacitive transducer is a first capacitive transducer, the device further comprising:
   a second oscillation circuit, the second oscillation circuit comprising:
      a second field-emission-based vacuum transistor; and
      a second capacitive transducer,
      wherein the first oscillation circuit is configured to have a first oscillation frequency in response to a set of stimuli at the first capacitive transducer, and wherein the second oscillation circuit is configured to have a second oscillation frequency in response to the set of stimuli at the second capacitive transducer that is different than the first oscillation frequency.

12. The device of claim 11, further comprising:
   one or more additional oscillation circuits, the one or more additional oscillation circuits comprising:
      one or more additional field-emission-based vacuum transistors; and
      one or more additional capacitive transducers,
      wherein the one or more additional oscillation circuits are configured to have additional oscillation frequencies in response to the set of stimuli at the one or more additional capacitive transducers that are different than the first oscillation frequency and the second oscillation frequency, and that are different from each other.

13. A device comprising:
   an oscillation circuit, the oscillation circuit comprising:
      at least one field-emission-based vacuum transistor; and
      at least one capacitive transducer, wherein the capacitive transducer comprises a cantilever positioned between a first electrode and a second electrode, and wherein a variable capacitance of the capacitive transducer is based on vibration of the cantilever,
      wherein the oscillation circuit omits any thermionic-emission-based vacuum device.

14. The device of claim 13, wherein an oscillation frequency of the oscillation circuit is based on the variable capacitance of the capacitive transducer.

15. The device of claim 14, wherein the oscillation frequency is indicative of a magnitude of the vibration.

16. The device of claim 15, further comprising additional oscillation circuits, the additional oscillation circuits comprising:

additional field-emission-based vacuum transistors; and
additional capacitive transducers, wherein additional oscillation frequencies of the additional oscillation circuits are indicative of magnitudes of temperatures, pressures, or additional vibrations at the additional capacitive transducers.

17. A device comprising:
a substrate; and
an oscillation circuit integrated with the substrate, the oscillation circuit comprising:
a first field-emission-based vacuum transistor;
additional field-emission-based vacuum transistors; and
a capacitive transducer,
wherein the oscillation circuit is a Wein bridge oscillation circuit, and wherein the first field-emission-based vacuum transistor, the additional field-emission-based vacuum transistors, and the capacitive transducer are configured in combination with other components to effect and sustain oscillation.

18. The device of claim 17, wherein the capacitive transducer comprises:
a first electrode positioned on a first wall; and
a second electrode positioned on a second wall, wherein a distance between the first electrode and the second electrode is proportional to a pressure exerted on the first wall, the second wall, or both, and wherein a variable capacitance of the capacitive transducer is based on the pressure.

19. The device of claim 17, wherein the oscillation circuit is a feedback oscillation circuit, wherein the field-emission-based vacuum transistor is a first field-emission-based vacuum transistor, wherein the feedback oscillation circuit further comprises at least a second field-emission-based vacuum transistor.

20. The device of claim 17, wherein the substrate comprises a material capable of withstanding any temperature between −80° C. and 800° C. and capable of withstanding radiation exposure greater than $1 \times 10^6$ rad.

* * * * *